(12) United States Patent  
Kim et al.

(10) Patent No.: US 8,962,444 B2
(45) Date of Patent: Feb. 24, 2015

(54) SEMICONDUCTOR DEVICE AND METHOD OF MANUFACTURING THE SAME

(71) Applicant: Samsung Electronics Co., Ltd, Suwon-si (KR)

(72) Inventors: Jung-Hwan Kim, Seoul (KR); Sunggil Kim, Yongin-si (KR); HongSuk Kim, Yongin-si (KR); Guk-Hyon Yon, Hwaseong-si (KR); Hunhyeong Lim, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/053,913

(22) Filed: Oct. 15, 2013

(65) Prior Publication Data

US 2014/0106537 A1    Apr. 17, 2014

(30) Foreign Application Priority Data

Oct. 15, 2012   (KR) .......................... 10-2012-0114307

(51) Int. Cl.
*H01L 21/76*   (2006.01)
*H01L 21/762*   (2006.01)

(52) U.S. Cl.
CPC ................................ *H01L 21/76224* (2013.01)
USPC ............................. 438/424; 438/257; 438/542

(58) Field of Classification Search
USPC .......................................... 438/257, 424, 542
See application file for complete search history.

(56) References Cited

U.S. PATENT DOCUMENTS

| | | | |
|---|---|---|---|
| 5,885,904 A | 3/1999 | Mehta et al. | |
| 6,797,601 B2 | 9/2004 | Schuegraf et al. | |
| 7,368,780 B2 * | 5/2008 | Tanaka et al. | 257/315 |
| 7,663,178 B2 | 2/2010 | Arai et al. | |
| 7,718,483 B2 | 5/2010 | Mizushima et al. | |
| 8,088,661 B2 | 1/2012 | Arai et al. | |

FOREIGN PATENT DOCUMENTS

| | | |
|---|---|---|
| JP | 2007-266499 | 10/2007 |
| JP | 2011-114235 | 6/2011 |
| KR | 10-2008-0103703 A | 11/2008 |
| KR | 10-2009-0103051 A | 10/2009 |
| KR | 10-2010-0003447 A | 1/2010 |
| KR | 10-2010-0005999 A | 1/2010 |

\* cited by examiner

*Primary Examiner* — Bradley K Smith
(74) *Attorney, Agent, or Firm* — Muir Patent Consulting, PLLC

(57) ABSTRACT

Methods of manufacturing a semiconductor device are provided. The method includes forming a poly-silicon layer doped with first p-type dopants on a substrate, etching the poly-silicon layer and the substrate to form a poly-silicon pattern and a trench, forming device isolation pattern covering a lower sidewall of the poly-silicon pattern in the trench, thermally treating the poly-silicon pattern in a gas including second p-type dopants, forming a dielectric layer and a conductive layer on the thermally treated poly-silicon pattern and the device isolation pattern, etching the conductive layer, the dielectric layer, and the thermally treated poly-silicon pattern to form a control gate, a dielectric pattern, and a floating gate respectively.

20 Claims, 11 Drawing Sheets

SEMICONDUCTOR DEVICE AND METHOD OF MANUFACTURING THE SAME

CROSS-REFERENCE TO RELATED APPLICATION

This application claims priority under 35 U.S.C. §119 to Korean Patent Application No. 10-2012-0114307, filed on Oct. 15, 2012, in the Korean Intellectual Property Office, the disclosure of which is hereby incorporated by reference in its entirety.

BACKGROUND

This disclosure relates to methods of manufacturing a semiconductor device, more particularly, to methods of manufacturing a non-volatile memory device.

As semiconductor devices have become increasingly integrated, various problems (e.g., margin decrease of photolithography processes) have arisen, such that it may be increasingly difficult to manufacture semiconductor devices.

SUMMARY

Embodiments of the disclosure may provide methods of manufacturing an integrated semiconductor device.

In an aspect, a method of manufacturing the semiconductor device may include: forming a poly-silicon layer doped with a first p-type dopant on a substrate; etching the poly-silicon layer and the substrate to form a poly-silicon pattern and a trench; forming a device isolation pattern in the trench, wherein the device isolation pattern covers a sidewall of the lower portion of the poly-silicon pattern; thermally treating the poly-silicon pattern under a reaction gas atmosphere, wherein the reaction gas of the reaction gas atmosphere comprises a second p-type dopant; forming a dielectric layer and a conductive layer on the thermally treated poly-silicon pattern and the device isolation pattern; and etching the conductive layer, the dielectric layer, and the thermally treated poly-silicon pattern to form a control gate, a dielectric pattern, and a floating gate respectively.

In some embodiments, the second p-type dopant of the reaction gas may include boron (B); and the reaction gas may include $B_2H_6$.

In some embodiments, the reaction gas may further include an etching material; and the etching material may include chlorine (Cl) or fluorine (F).

In some embodiments, the reaction gas may include $BCl_3$ or $BF_3$.

In some embodiments, the reaction gas may further include a nitrogen ($N_2$) gas.

In some embodiments, the poly-silicon pattern may be thermally treated at a temperature of about 700 degrees Celsius or more.

In some embodiments, after thermally treating the poly-silicon pattern, the method may further include: injecting an oxygen (O2) gas into a chamber where the poly-silicon pattern has been thermally treated, thereby purging the reaction gas from the chamber. The thermal treatment of the poly-silicon pattern may be performed at a first pressure, and the purging of the remaining reaction gas may be performed at a second pressure lower than the first pressure.

In some embodiments, the floating gate may further include carbon (C).

In some embodiments, the top surface of the device isolation pattern may be disposed in substantially the same plane as the surface of the lower portions of the floating gate.

In some embodiments, the top surface of the device isolation pattern may be higher than a top surface of the substrate.

In some embodiments, the method may further include: forming a tunnel insulating layer between the substrate and the poly-silicon layer.

In some embodiments, the device isolation pattern may include an air gap.

BRIEF DESCRIPTION OF THE DRAWINGS

The disclosure will become more apparent in view of the attached drawings and accompanying detailed description.

DETAILED DESCRIPTION OF THE EMBODIMENTS

Figure 1:
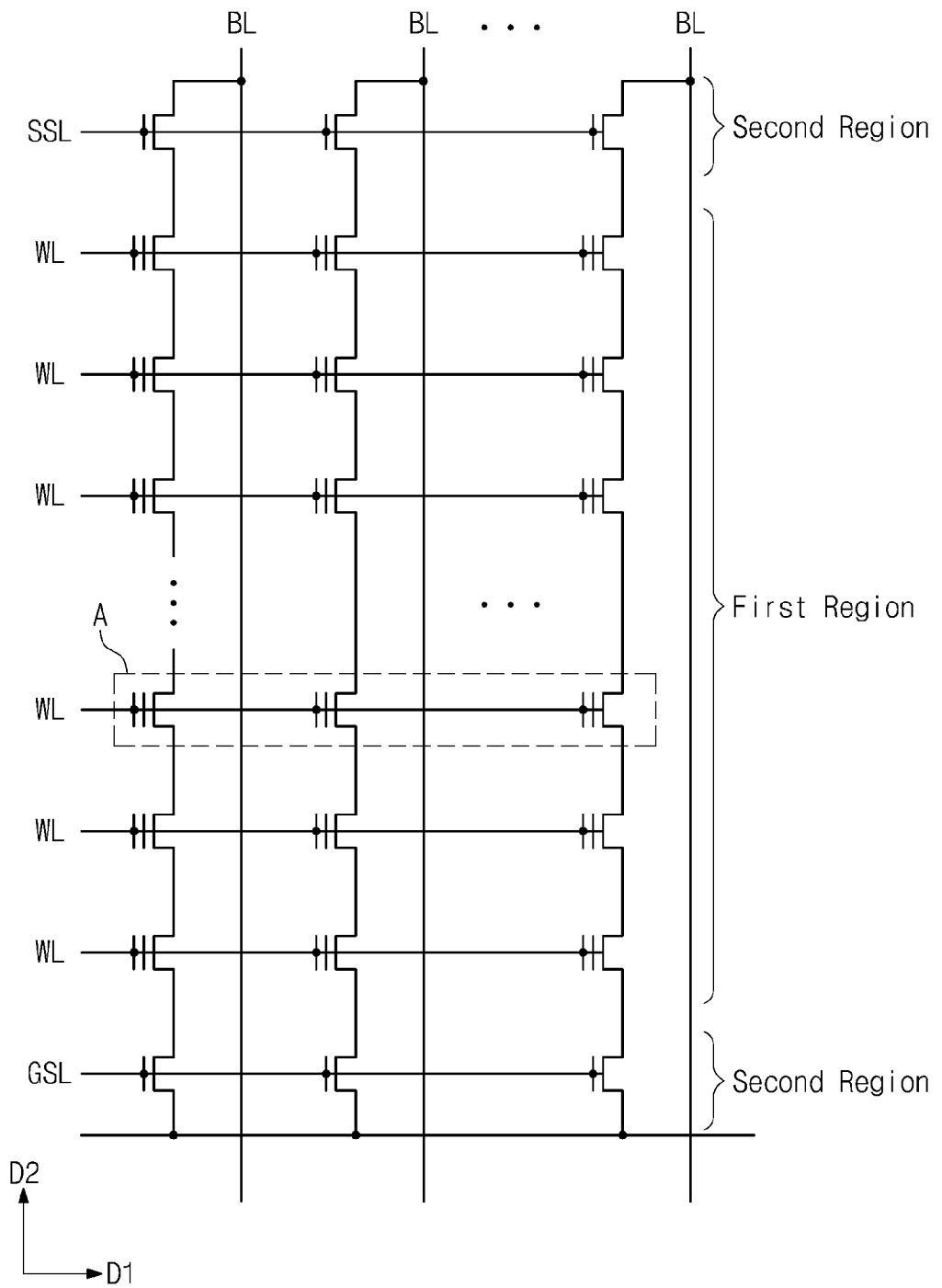
FIG. 1 is a circuit diagram of a semiconductor device according to example embodiments of the disclosure.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to explain the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that may be idealized exemplary illustrations. Accordingly, variations from the shapes of the illustrations are expected, for example, as a result of manufacturing techniques and/or tolerances. Thus, exemplary embodiments should not be construed as limited to the shapes illustrated herein but are to include deviations in shapes that may result from manufacturing. For example, an etching region illustrated as a rectangle will, typically, have rounded or curved features. Thus, the regions illustrated in the figures are schematic in nature and their shapes are not intended to limit the scope of example embodiments.

FIG. 1 is a circuit diagram of a semiconductor device according to example embodiments of the inventive concepts.

Referring to FIG. 1, a semiconductor device according to embodiments of the disclosure may be a NAND flash memory device.

The semiconductor device may include a plurality of memory cells and selection lines. The plurality of memory cells may be formed in a first region. The selection lines may be formed in second regions disposed at both sides of the first region. The selection lines may include a string selection line SSL and a ground selection line GSL.

The semiconductor device may include a plurality of word lines WL and a plurality of bit lines BL.

Each of the word lines WL may be connected in parallel to a plurality of the memory cells. The word lines WL may extend in a first direction D1 and may be parallel to each other.

Each of the bit lines BL may be connected in series to a string selection transistor, a plurality of the memory cells, and a ground selection transistor. The bit lines BL may extend in a second direction D2 different from the extending direction of the word lines WL. The bit lines BL may be parallel to each other. For example, the word lines WL may be perpendicular to the bit lines BL. In other words, the first direction D1 may be perpendicular to the second direction D2.

FIGS. 2A through 2G are cross-sectional views illustrating a method of manufacturing a semiconductor device according to some embodiments of the disclosure. FIGS. 2A through 2G are cross-sectional views illustrating a method of manufacturing a semiconductor device of the portion A of FIG. 1.

Figure 2A:
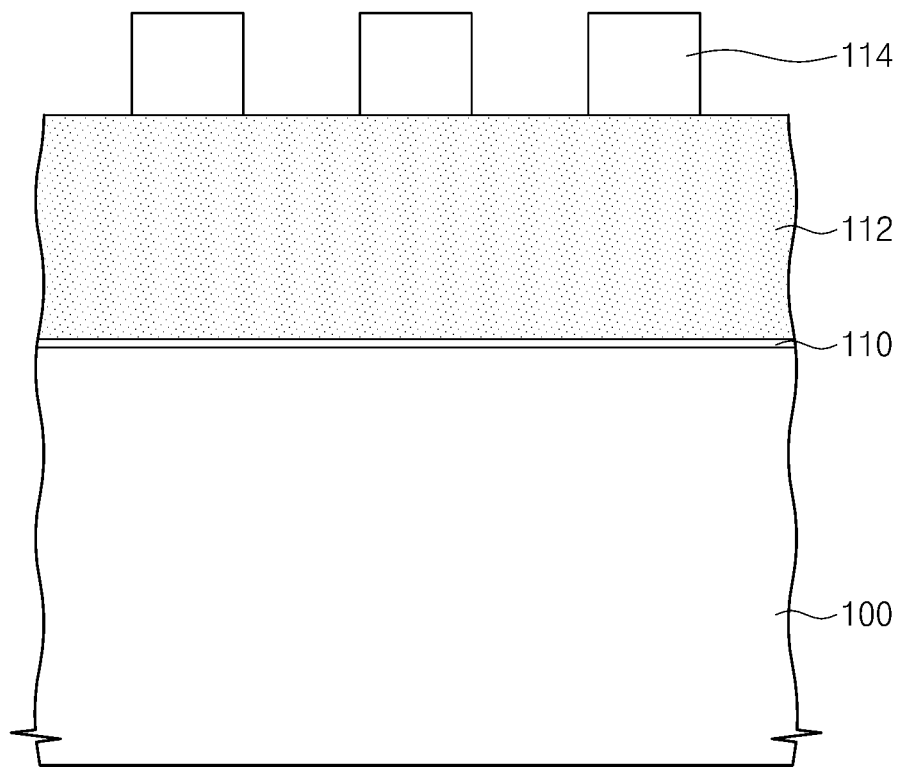
FIGS. 2A through 2G are cross-sectional views illustrating a method of manufacturing a semiconductor device according to some embodiments of the disclosure.

Referring to FIG. 2A, a tunnel insulating layer 110, a poly-silicon layer 112, and masks 114 may be sequentially formed on a substrate 100.

The tunnel insulating layer 110 may include silicon oxide and/or a metal oxide (e.g., hafnium oxide, aluminum oxide, and/or zinc oxide).

The poly-silicon layer 112 may be doped with a p-type dopant. For example, the p-type dopant may be boron (B). In other embodiment, the poly-silicon layer 112 may further be doped with carbon (C). The carbon concentration in the poly-silicon layer 112 may be in the range of about 1% to about 10%.

The masks 114 may have linear shapes extending in the second direction D2 of FIG. 1.

Figure 2B:
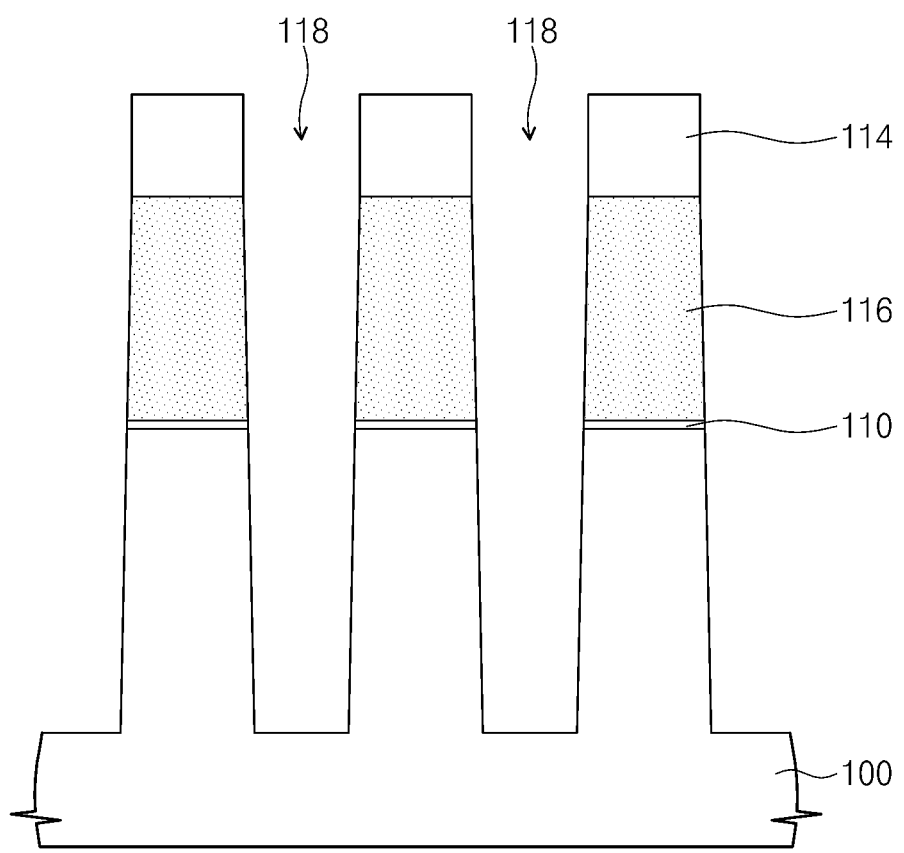

Referring to FIG. 2B, the poly-silicon layer 112, the tunnel insulating layer 110, and the substrate 100 may be etched using the masks 114 as etch masks to form a trench 118. Poly-silicon patterns 116 extending in the second direction D2 may be formed by the etching process.

Figure 2C:
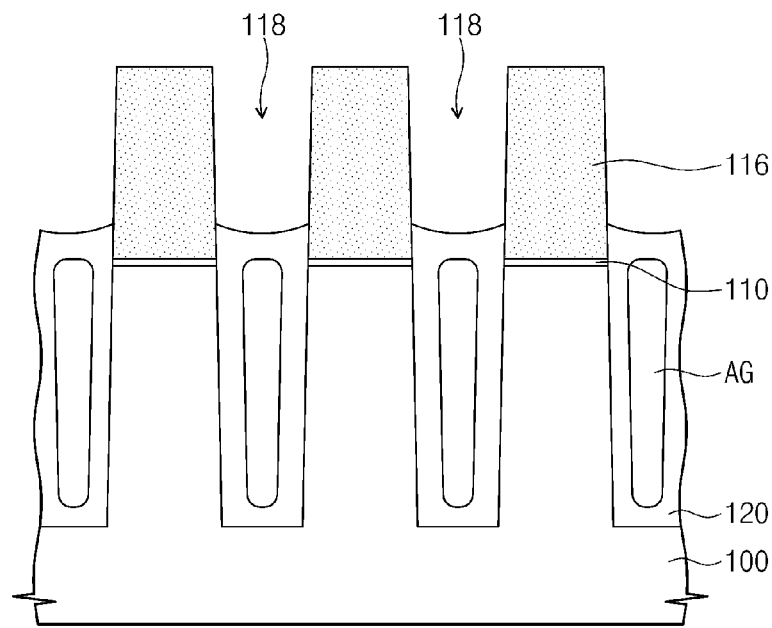

Referring to FIG. 2C, a device isolation pattern 120 may be formed in the trench 118, respectively. The device isolation pattern 120 may cover lower portions the poly-silicon patterns 116. A top surface of the device isolation pattern 120 may be higher than a top surface of the substrate 100.

According to some embodiments, a device isolation layer may be formed to have air gaps AG disposed in the trench 118 during the formation process of the device isolation pattern 120. A top surface of the device isolation layer may be etched to form the device isolation pattern 120 exposing sidewalls of upper portions of the poly-silicon patterns 116. In this case, the air gaps AG may not be exposed during the process of etching the device isolation layer.

According to other embodiments, a device isolation layer (not shown) may be formed to completely fill the trench 118 during the formation process of the device isolation pattern 120. The device isolation layer may include an oxide having an excellent gap-fill property. An upper portion of the device isolation layer may be etched to form the device isolation pattern 120 exposing sidewalls of upper portions of the poly-silicon patterns 116.

Figure 2D:
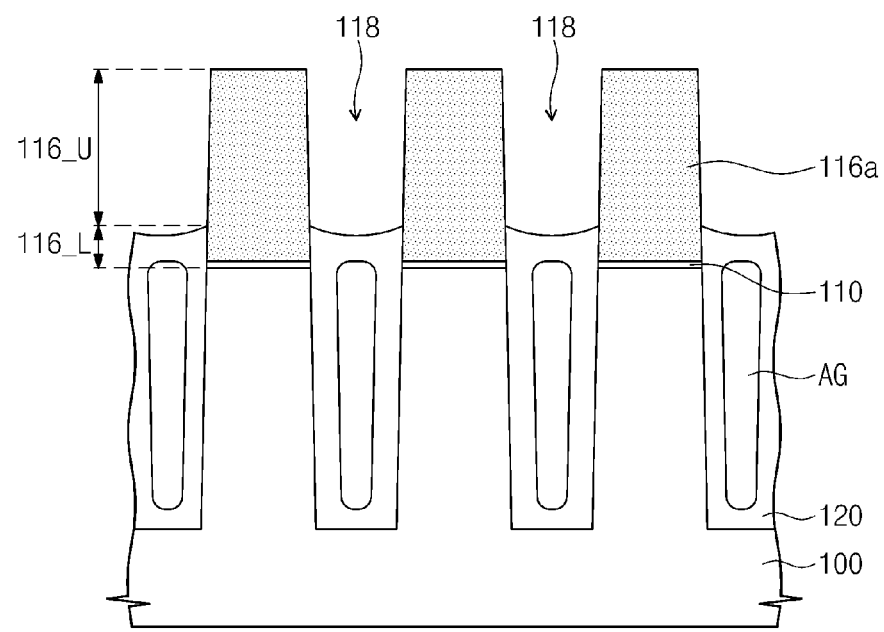

Referring to FIG. 2D, the upper portions 116_U of the poly-silicon patterns 116, which extend above the device isolation pattern 120, may be thermally treated under a reaction gas atmosphere. In FIG. 2D, a reference designator "116a" indicates the thermally treated poly-silicon pattern 116a.

According to some embodiments of the disclosure, the thermal treatment process may be performed at a first temperature of about 700 degrees Celsius or more at a first pressure of about 50 Torr (i.e., about 60,000 Pa) or more. If the thermal treatment process is performed at a temperature less than about 700 degrees Celsius, the reaction gas of the reaction gas atmosphere may not react with the poly-silicon patterns 116.

In some embodiments, the reaction gas may include p-type dopants. The p-type dopants may include boron (B), and the reaction gas may include $B_2H_6$. In other embodiments, the reaction gas may further include nitrogen ($N_2$) gas. The thermal treatment process may be performed on a single wafer or batch by batch.

The p-type dopants of the reaction gas may be diffused into the poly-silicon patterns 116 during the thermal treatment process. In some embodiments, the poly-silicon layer 112 may be doped with the p-type dopants in FIG. 2A and then the p-type dopants in the poly-silicon layer 112 may escape from the poly-silicon layer 112 through the processes described with reference to FIGS. 2B and 2C. Thus, a p-type dopant concentration of the poly-silicon pattern 116 in FIG. 2C may be lower than a desired concentration. However, the poly-silicon patterns 116 may further be doped with the p-type dopants of the reaction gas during the thermal treatment process described with reference to FIG. 2D. Thus, the p-type dopant concentration of the thermally treated poly-silicon patterns 116a may be increased to the desired concentration.

Referring again to FIG. 2D, the top surface of the device isolation pattern 120 may be disposed in substantially the same plane as surfaces of lower portions 116_L of the poly-silicon patterns. In other embodiments, the top surface of the device isolation pattern 120 may be disposed in a plane lower than the surfaces of the lower portions 116_L of the poly-silicon patterns.

Figure 2E:
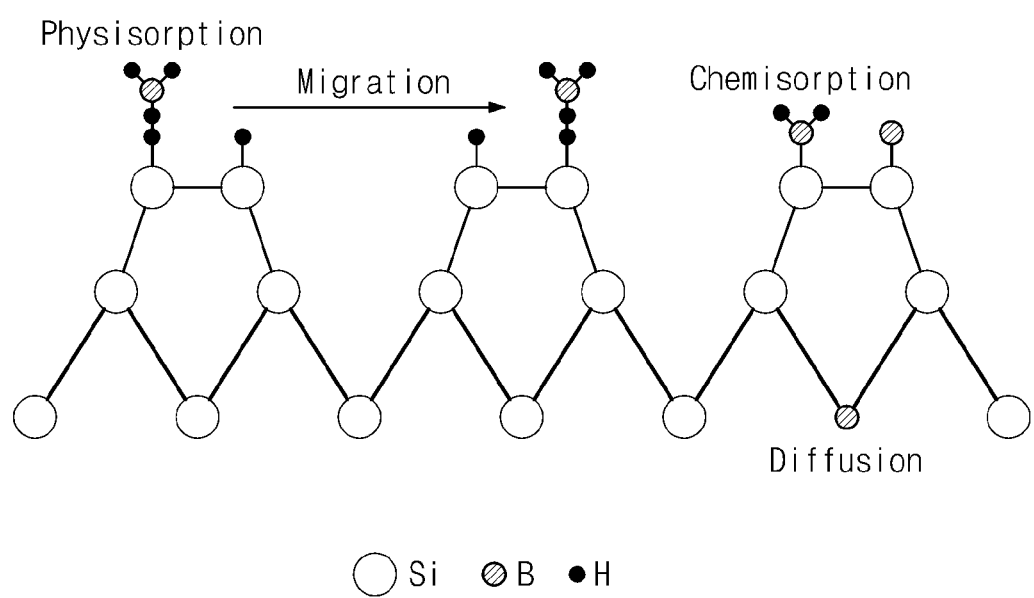

Referring to FIG. 2E, if the reaction gas includes $B_2H_6$, $B_2H_6$ molecules may be physically adsorbed on surfaces of the poly-silicon patterns 116. The physically adsorbed $B_2H_6$ molecules may migrate at the temperature of about 700 degrees Celsius. Thus, the $B_2H_6$ molecules may be chemisorbed on the poly-silicon patterns. In particular, $B^+$ ions may be diffused into the poly-silicon patterns 116. As a result, the thermally treated poly-silicon patterns 116a may have the desired concentration of boron.

The thermal treatment process may be performed in a chamber. After the thermal treatment process is performed, oxygen ($O_2$) gas may be injected into the chamber to purge the reaction gas remaining in the chamber. The purging process may be performed at a second temperature lower than the first temperature at a second pressure lower than the first pressure. The second temperature may be in the range from about 500 degree Celsius to about 700 degree Celsius, and the second pressure may be lower than about 200 Pa.

In some embodiments, the substrate 100 may include a cell region and a peripheral region. A poly-silicon pattern in the peripheral region may function as a gate electrode of the peripheral region. The gate electrode of the peripheral region may be masked during the thermal treatment process of FIGS. 2D and 2E. Thus, the boron concentration of the poly-silicon patterns 116a of the cell region may be higher than that of the poly-silicon pattern of the peripheral region.

Figure 2F:
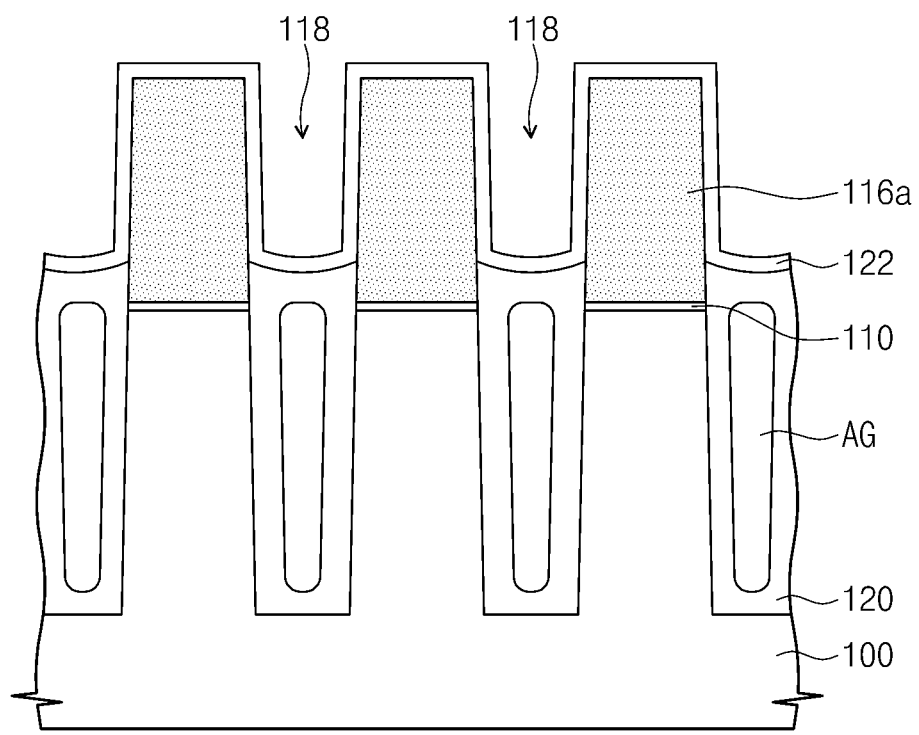

Referring to FIG. 2F, a dielectric layer 122 may be conformally formed on the poly-silicon patterns 116a and the device isolation pattern 120. The dielectric layer 122 may not fill gap regions between the poly-silicon patterns 116a.

The dielectric layer 122 may have a multi-layered structure. For example, the dielectric layer 122 may have an oxide layer, a nitride layer, and another oxide layer that are sequentially stacked.

Figure 2G:
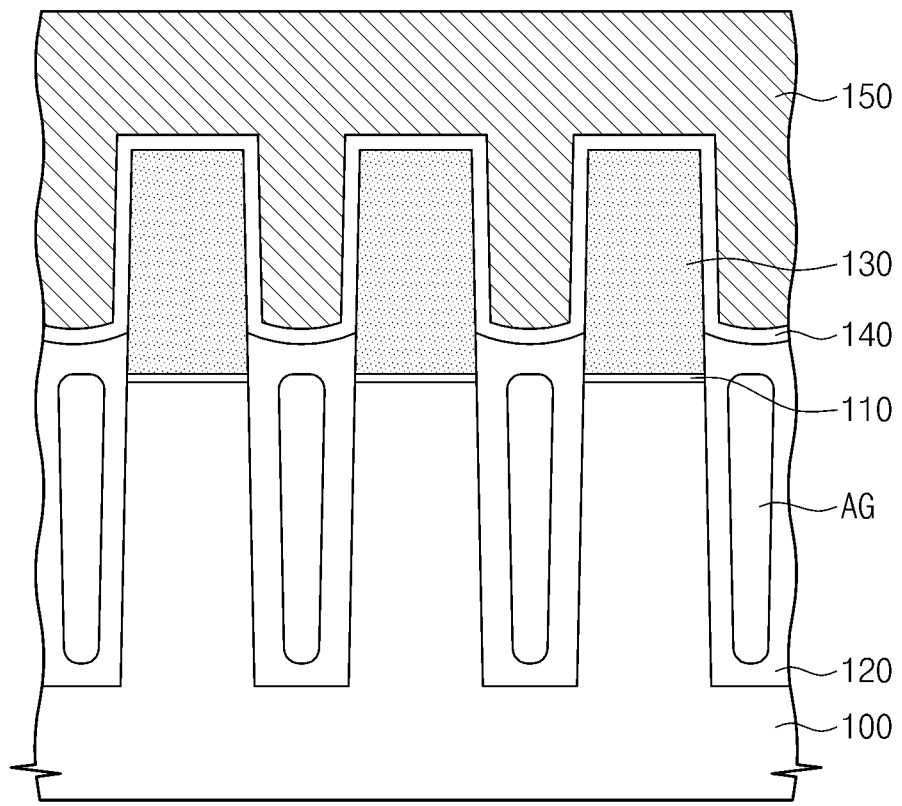

Referring to FIG. 2G, a conductive layer (not shown) may be formed on the dielectric layer 122. The conductive layer may include poly-silicon doped with dopants, metal, and/or metal compound.

Subsequently, the conductive layer, the dielectric layer 122, and the poly-silicon patterns 116 may be etched using a mask pattern extending in the first direction D1 of FIG. 1 to form a control gate 150, a dielectric pattern 140, and floating gates 130.

Figure 3A:
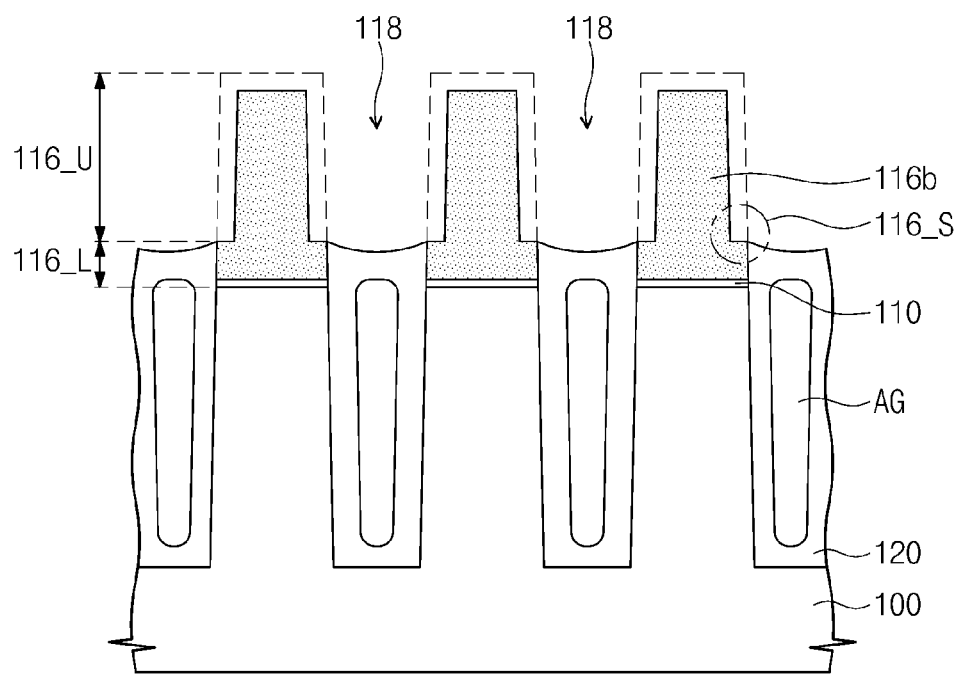
FIGS. 3A and 3B are cross-sectional views illustrating a method of manufacturing a semiconductor device according to other embodiments of the disclosure.
Figure 3B:
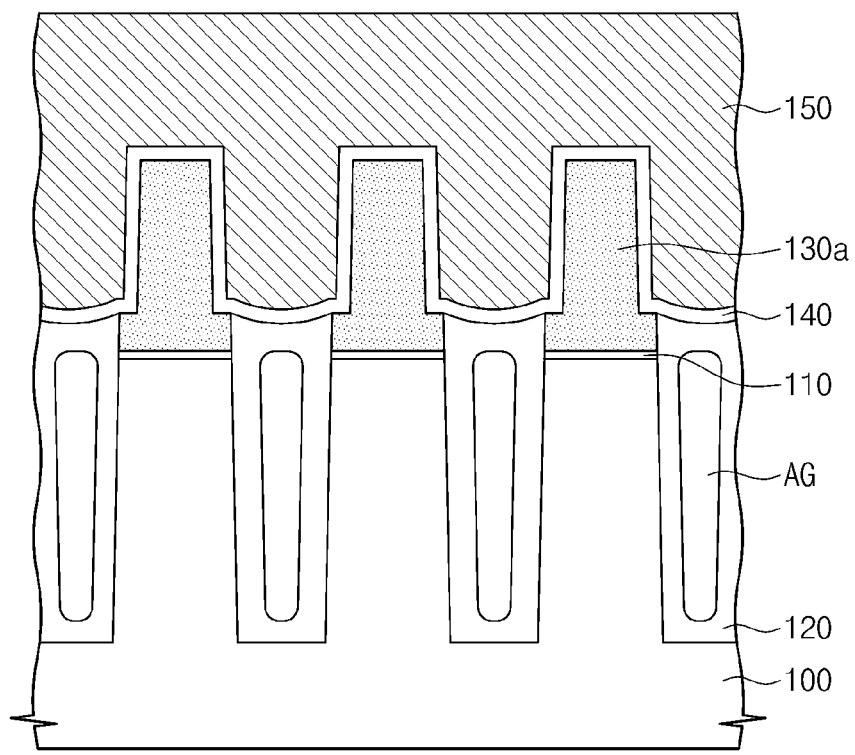

FIGS. 3A and 3B are cross-sectional views showing the portion A of FIG. 1 and illustrating a method of manufacturing a semiconductor device according to other embodiments of the disclosure.

Referring to FIG. 3A, a tunnel insulating layer, poly-silicon patterns, and a device isolation pattern 120 may be formed on a substrate 100. Lower portions of the poly-silicon patterns may be covered with the device isolation pattern 120. The tunnel insulating layer, the poly-silicon patterns and the device isolation pattern 120 may be formed by substantially the same processes as described with reference to FIGS. 2A to 2C, so the descriptions herein are omitted.

Upper portions of the poly-silicon patterns may be thermally treated under a reaction gas atmosphere.

In some embodiments, the thermal treatment process may be performed at a first temperature of about 700 degrees Celsius or more at a first pressure of about 50 Torr (i.e., about 60,000 Pa) or more. If the thermal treatment process is performed at a temperature lower than about 700 degrees Celsius, the reaction gas may not react with the poly-silicon patterns.

In some embodiments, the reaction gas may include p-type dopants and an etching material. For example, the reaction gas may include $BCl_3$ or $BF_3$. In other embodiments, the reaction gas may further include nitrogen ($N_2$) gas. According to some embodiments, the thermal treatment process may be performed on a single wafer or batch by batch.

The p-type dopants of the reaction gas may be diffused into the poly-silicon patterns during the thermal treatment process. In some embodiments, the poly-silicon layer 112 may be doped with the p-type dopants in FIG. 2A and then the p-type dopants in the poly-silicon layer 112 may escape from the poly-silicon layer 112 through the processes described with reference to FIGS. 2B and 2C. Thus, a p-type dopant concentration of the poly-silicon pattern 116 in FIG. 2C may be lower than a desired concentration. However, the poly-silicon patterns 116 may further be doped with the p-type dopants in the reaction gas during the thermal treatment process described with reference to FIG. 3A. Thus, a p-type dopant concentration of the thermally treated poly-silicon patterns 116b of FIG. 3A may be increased to a desired concentration.

Additionally, the etching material of the reaction gas may etch the poly-silicon patterns during the thermal treatment process according to the present embodiment. In some embodiments, the etching material of the reaction gas may include chlorine (Cl) or fluorine (F). The chlorine (Cl) or fluorine (F) may react with silicon (Si) of surfaces of the poly-silicon patterns and then may be converted into a byproduct gas such as $SiCl_4$ or $SiF_4$. As a result, the poly-silicon patterns may be isotropically etched. As illustrated in FIG. 3A, the lower portions 116_L of the poly-silicon patterns covered by the device isolation pattern 120 may not be etched, but the exposed upper portions 116_U of the poly-silicon patterns 120 may be isotropically etched. Thus, a step shape 116_S may be formed between the upper portion 116_U and the lower portion 116_L of the thermally treated poly-silicon pattern 116b. Since the upper portions 116_U of the poly-silicon patterns are etched during the thermal treatment process, the distance between the poly-silicon patterns 116b adjacent to each other may be increased. Thus, electric short defects between adjacent poly-silicon patterns 116b may be prevented or have a lower chance of occurring. Additionally, since the distance between the adjacent poly-silicon patterns 116b is increased, electromagnetic interference between the poly-silicon patterns 116b may be reduced or minimized.

Referring to FIG. 3A, a top surface of the device isolation pattern 120 may be disposed in substantially the same plane as surfaces of the lower portions 116_L of the poly-silicon patterns 116b. In some other embodiments, the top surface of the device isolation pattern 120 may be disposed in a plane lower than the surfaces of the lower portions 116_L of the poly-silicon patterns 116b.

In some embodiments, if the reaction gas includes $BCl_3$, the $BCl_3$ molecules in the reaction gas may be decomposed into $B^+$ ions and $Cl^-$ ions. The $B^+$ ions may be diffused into the poly-silicon patterns 116, and the $Cl^-$ ions may be combined with surface silicon (Si) of the poly-silicon patterns 116 to form $SiCl_4$ gas. Thus, the exposed upper portions 116_U of the poly-silicon patterns may be etched.

After the thermal treatment process is performed, oxygen ($O_2$) gas may be injected into a chamber where the thermal treatment process has been performed. The reaction gas remaining in the chamber may be purged by the oxygen ($O_2$) gas. The purging process may be performed at a second temperature lower than the first temperature at a second pressure lower than the first pressure. The second temperature may be in the range from about 500 degree Celsius to about 700 degree Celsius. The second pressure may be lower than about 200 Pa.

Referring to FIG. 3B, a dielectric layer may be conformally formed on the poly-silicon patterns 116b and the device isolation pattern 120 and then a conductive layer may be formed on the dielectric layer. Next, the conductive layer, the dielectric layer, and the poly-silicon patterns 116b may be etched using a mask pattern extending in the first direction Dl of FIG. 1 to form respectively a control gate 150, a dielectric pattern 140, and floating gates 130a.

The control gate 150, the dielectric pattern 140, and the floating gates 130a may be formed by substantially the same processes described with reference to FIGS. 2F and 2G, so that the descriptions herein are omitted.

The distance between the adjacent poly-silicon patterns 116b may increase by the thermal treatment process of the present embodiment. Thus, a void and/or a seam may decrease in the conductive layer formed in between the poly-silicon patterns 116b after the dielectric layer is formed.

Figure 4A:
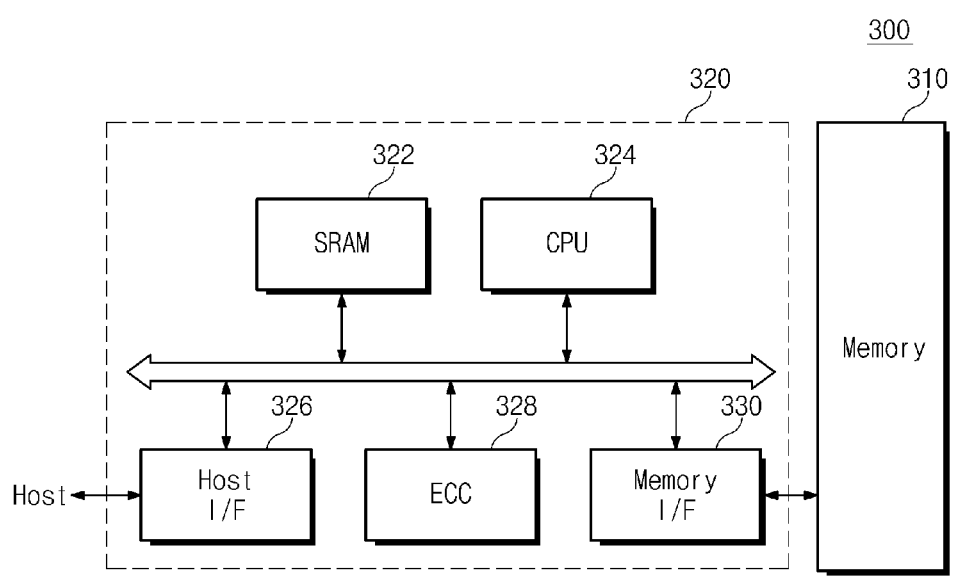
FIG. 4A is a schematic block diagram illustrating an example of memory cards including semiconductor devices according to embodiments of the disclosure.

FIG. 4A is a schematic block diagram illustrating an example of a memory card including a semiconductor device according to an embodiment of the disclosure.

Referring to FIG. 4A, the semiconductor devices according to the aforementioned embodiments may be applied to a memory card 300. For example, the memory card 300 may include a memory controller 320 that controls data communication between a host and a memory device 310. A static random access memory (SRAM) device 322 may be used as an operation memory of a central processing unit (CPU) 324. A host interface unit 326 may be configured to include a data communication protocol between the memory card 300 and the host. An error check and correction (ECC) block 328 may detect and correct errors of data which are read out from the memory device 310. A memory interface unit 330 may interface with the memory device 310. The CPU 324 controls overall operations of the memory controller 320.

The memory device 310 in the memory card 300 may include at least one of the semiconductor devices according to the aforementioned embodiments of the disclosure. Thus, the dopant concentration of the floating gates 130 of FIGS. 2G and 3B may be suitably maintained and the electric short between the floating gates adjacent to each other may be prevented.

Figure 4B:
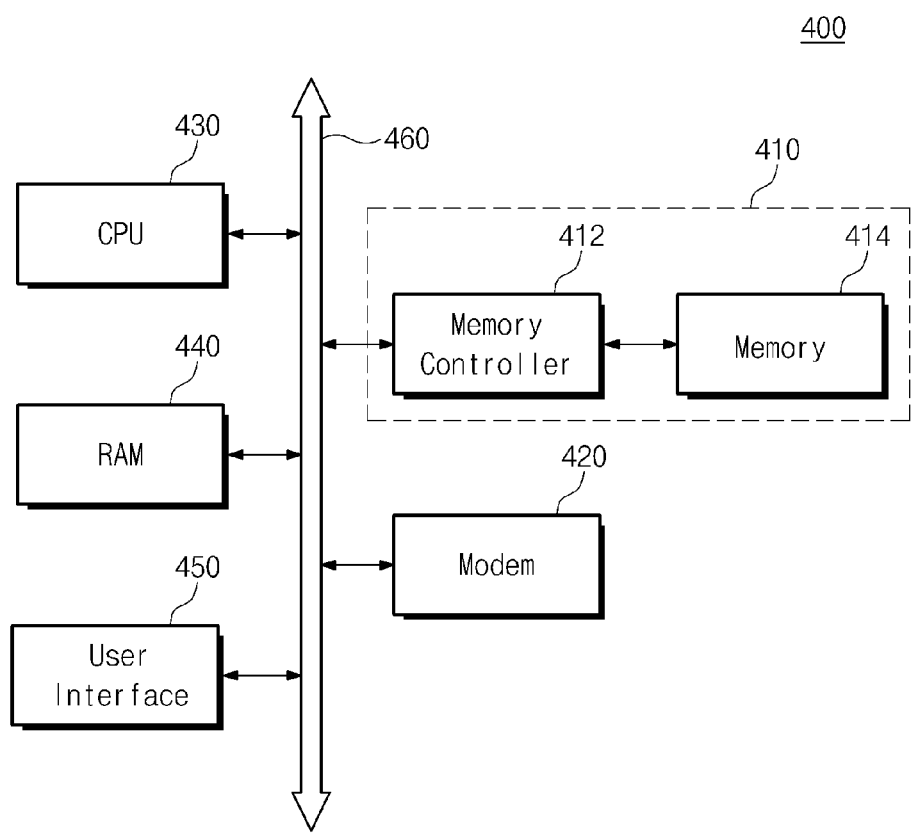
FIG. 4B is a schematic block diagram illustrating an example of systems including semiconductor devices according to embodiments of the disclosure.

FIG. 4B is a schematic block diagram illustrating an exemplary information processing system including a semiconductor device according to an embodiment of the disclosure.

Referring to FIG. 4B, an information processing system 400 may include at least one of the semiconductor devices according to the embodiments described above. The information processing system 400 may be a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the CPU 430 or data inputted from an external system. The memory system 410 may include a memory device 414 and a memory controller 412. The memory system 410 may have substantially the same structure as the memory card 300 described with reference to FIG. 4A. The information processing system 400 may be realized with a memory card, a solid state disk (SSD) device, a camera image sensor, or another type of application chipset. For example, if the memory system 410 may be realized with an SSD device, the information processing system 400 may stably and reliably store massive data.

According to embodiments of the disclosure, the distance between the adjacent floating gates may increase and the dopant concentration of the floating gates may be sufficiently secured. Thus, the electrical reliability of the semiconductor device including the floating gates may be improved.

While the disclosure has been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scope of the disclosure is to be determined by the broadest permissible interpretation of the following claims and their equivalents, and shall not be restricted or limited by the foregoing description.

What is claimed:

1. A method of manufacturing a semiconductor device comprising:
    forming a poly-silicon layer doped with first p-type dopants on a substrate;
    etching the poly-silicon layer and the substrate to form a poly-silicon pattern and a trench;
    forming a device isolation pattern in the trench;
    thermally treating the poly-silicon pattern in a first gas comprising second p-type dopants;
    forming a dielectric layer and a conductive layer on the thermally treated poly-silicon pattern and the device isolation pattern; and
    etching the conductive layer, the dielectric layer, and the thermally treated poly-silicon pattern to form a control gate, a dielectric pattern, and a floating gate.

2. The method of claim 1, wherein the second p-type dopant of the first gas comprises boron (B); and
    the first gas further comprises $B_2H_6$.

3. The method of claim 1, wherein the first gas further comprises chlorine (Cl) or fluorine (F).

4. The method of claim 3, wherein the first gas further comprises $BCl_3$ or $BF_3$.

5. The method of claim 1, wherein the first gas further comprises nitrogen ($N_2$) gas.

6. The method of claim 1, wherein the poly-silicon pattern is thermally treated at a temperature of about 700 degrees Celsius or more.

7. The method of claim 1, further comprising:
    injecting oxygen (O2) gas into the chamber where the poly-silicon pattern has been thermally treated, thereby purging the first gas from the chamber,
    wherein the thermal treatment of the poly-silicon pattern is performed at a first pressure; and the remaining first gas is purged at a second pressure lower than the first pressure.

8. The method of claim 1, wherein the floating gate further comprises carbon (C).

9. The method of claim 1, wherein the top surface of the device isolation pattern is disposed in substantially the same plane as surfaces of the lower portion of the floating gate.

10. The method of claim 1, wherein the top surface of the device isolation pattern is higher than the top surface of the substrate.

11. The method of claim 1, further comprising:
forming a tunnel insulating layer between the substrate and the poly-silicon layer.

12. The method of claim 1, wherein the device isolation pattern includes an air gap.

13. The method of claim 1, wherein the poly-silicon pattern comprises a lower portion covered with the device isolation pattern and an upper portion extending above the device isolation pattern, and
the lower portion is wider than the upper portion.

14. A method of manufacturing a semiconductor device comprising:
forming a poly-silicon layer doped with first p-type dopants on a substrate;
etching the poly-silicon layer and the substrate to form a first poly-silicon pattern and a trench;
forming a device isolation pattern in the trench;
concurrently thermally treating and doping the first poly-silicon pattern in a first gas comprising second p-type dopants;

forming a dielectric layer and a conductive layer on the thermally treated first poly-silicon pattern and the device isolation pattern; and
etching the conductive layer, the dielectric layer, and the thermally treated first poly-silicon pattern.

15. The method of claim 14, wherein the substrate comprises a cell region and a peripheral region,
the poly-silicon layer is formed on the cell region and the peripheral region, and
the first poly-silicon pattern is formed on the cell region.

16. The method of claim 15, further comprising:
etching the poly-silicon layer to form a second poly-silicon pattern on the peripheral region and the second poly-silicon pattern is masked during the thermal treatment in the first gas.

17. The method of claim 16, wherein the conductive layer, the dielectric layer, and the thermally treated first poly-silicon pattern is etched to form a control gate, a dielectric pattern, and a floating gate respectively.

18. The method of claim 17,
wherein the second poly-silicon pattern comprises a gate electrode in the peripheral region.

19. The method of claim 16, wherein the first p-type dopants and the second p-type dopants are Boron, and
the boron concentration in the first poly-silicon pattern is higher than the boron concentration in the second poly-silicon pattern.

20. The method of claim 14, wherein the first gas further comprises $BCl_3$, $BF_3$, $B_2H_6$, nitrogen ($N_2$), chlorine (Cl) or fluorine (F).

* * * * *